(12) United States Patent
Haraguchi et al.

(10) Patent No.: US 6,340,281 B1
(45) Date of Patent: Jan. 22, 2002

(54) METHOD AND APPARATUS FOR POSITIONING A DISK-SHAPED OBJECT

(75) Inventors: Hideo Haraguchi, Toyonaka; Izuru Matsuda, Kadoma, both of (JP)

(73) Assignee: Matsushita Electric Industrial Co., Ltd. (JP)

(*) Notice: Subject to any disclaimer, the term of this patent is extended or adjusted under 35 U.S.C. 154(b) by 0 days.

(21) Appl. No.: 09/291,148

(22) Filed: Apr. 15, 1999

(30) Foreign Application Priority Data

Apr. 16, 1998 (JP) ............................................. 10-105271

(51) Int. Cl.$^7$ ............................................... B65G 47/24
(52) U.S. Cl. ........................................ 414/783; 414/936
(58) Field of Search .................................. 414/783, 936

(56) References Cited

U.S. PATENT DOCUMENTS

| | | | |
|---|---|---|---|
| 5,238,354 A | * 8/1993 | Volovich | 414/779 |
| 5,740,034 A | * 4/1998 | Saeki | 414/783 X |
| 5,830,277 A | * 11/1998 | Johnsgard et al. | 118/725 |
| 5,911,834 A | * 6/1999 | Fairbairn et al. | 134/1.3 |
| 5,982,986 A | * 11/1999 | Davenport | 392/418 |
| 6,051,066 A | * 4/2000 | Begin | 414/936 X |

* cited by examiner

Primary Examiner—Janice L. Krizek
(74) Attorney, Agent, or Firm—Parkhurst & Wendel, L.L.P.

(57) ABSTRACT

Objects of the present invention are to prolong the life of a sealing portion by using bellows and to prevent the generation of dust and the effect thereof. A support member for positioning is extended to the outside through an opening of a vacuum vessel and bellows connected to the circumference of the opening with a play such that positioning movement can be performed without being in contact with the opening and the bellows, and the support member is received by roller bearings in a bulkhead portion connected to a free end of the bellows and closing the bellows of a bearing support. Necessary rotation is given to the support member from outside via inside and outside magnetic couplings facing each other on the inside and outside of the bulkhead portion, and movement in the X direction perpendicular to the axis is given to the support member from outside by moving the bearing support in the direction perpendicular to the axis with respect to the vacuum vessel. Thereby, a disk-shaped object is positioned without necessitating a sliding portion located in the vacuum vessel, thereby achieving the above objects.

4 Claims, 5 Drawing Sheets

METHOD AND APPARATUS FOR POSITIONING A DISK-SHAPED OBJECT

FIELD OF THE INVENTION

The present invention relates to a method and an apparatus for positioning a disk-shaped object in a predetermined position and orientation.

BACKGROUND OF THE INVENTION

For example, a reaction chamber is used to form an electrode pattern on the surface of a semiconductor wafer by plasma dry etching. This processing operation is a minute and delicate one, in which a wafer is held on an electrode in a reaction chamber, for example, by electrostatic attraction, vacuum is produced in the reaction chamber and plasma gas is generated, and heat transfer gas such as He gas is supplied onto the back surface of the wafer facing the electrode to keep the temperature, by which the operation is performed. In order to achieve such an operation with required accuracy, the wafer must be placed on the electrode with high positional accuracy. In many cases, since the wafer has a disk shape, the position of its center becomes a problem. Also, since the wafer is a single crystal, the electrode pattern or the like must be formed corresponding to the orientation of the crystal. Therefore, the positioning necessary for the aforesaid operation must be performed with regard to the position of the wafer center and the orientation around the center.

Figure 6:
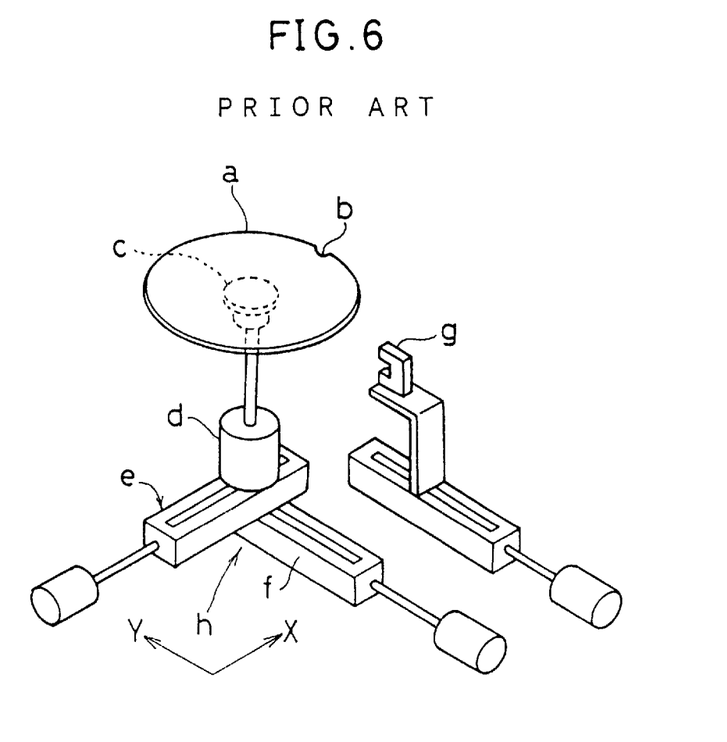
FIG. 6 is a perspective view of a conventional apparatus for performing positioning in the atmosphere.

To position such a disk-shaped object with regard to the center position and orientation thereof, a notch b, which is an orientation flat (straight cut portion) or a notch indicating the orientation of a disk-shaped object a, is formed at the outer periphery of the disk-shaped object a as shown in FIG. 6. After this disk-shaped object a is placed on a rotating stage c, the rotating stage c is moved together with a rotating mechanism d in two directions of X and Y perpendicular to each other by using an X-direction moving table e and a Y-direction moving table f, by which the center position of the disk-shaped object a is positioned at a predetermined position. To orient this disk-shaped object a, whose center has been positioned, around the center thereof, the rotating stage c is turned by the rotating mechanism d such as a motor so that the notch b formed in the disk-shaped object a is oriented in a predetermined direction. In positioning, the center position of the disk-shaped object a is judged by detecting about three points of outer periphery of the disk-shaped object a by using a range-finding sensor g, and the rotating stage c is moved so that the judged center position becomes the predetermined position. The orientation of the disk-shaped object a, whose center has been positioned, is judged by detecting the direction of the notch b by using the range-finding sensor g, and the rotating stage c is turned so that the detected direction becomes the predetermined direction. The above described positioning mechanism is usually formed into a unit. In positioning in the atmosphere, this unit is arranged in an air flow of down flow, and a mechanism portion h is located under the disk-shaped object a to prevent dust produced by the mechanism portion h from flying up, by which dust is prevented from affecting the delicate processing operation, and the quality is prevented from being degraded.

Figure 7:
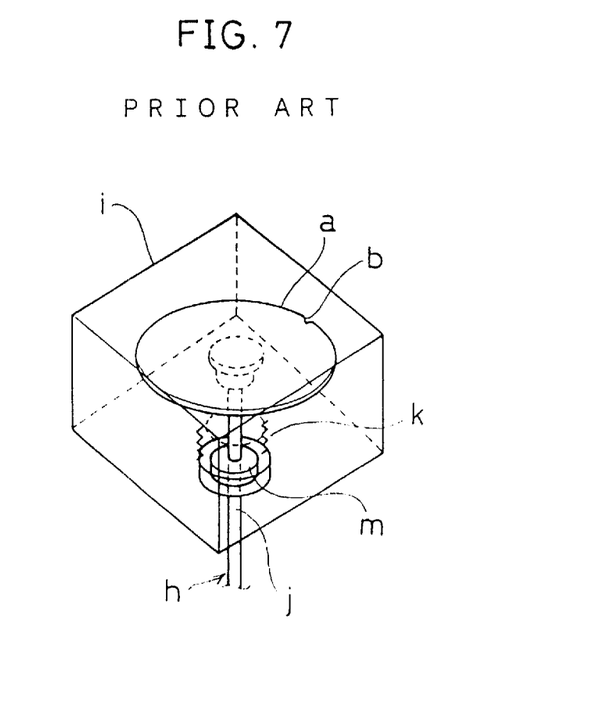
FIG. 7 is a perspective view in a case where the apparatus shown in FIG. 6 is used for positioning in a vacuum vessel.

When a vacuum vessel i communicating with the reaction chamber, as shown in FIG. 7, is used, the mechanism portion h is arranged under the vacuum vessel i, and the rotating stage c is located in the vacuum vessel i from the downside. In this case, it is necessary to seal a portion that a rotating shaft j of the rotating stage c passes through to prevent leakage when a vacuum is produced in the reaction chamber. For this purpose, a portion of the vacuum vessel i that the rotating shaft j passes through is covered with bellows k. Specifically, one end of the bellows k is connected to the circumference of the opening of the vacuum vessel i that the rotating shaft j passes through, and a vacuum seal m connected to the other end of the bellows k and the rotating shaft j are in slidable contact with each other while maintaining airtightness. Thereupon, the aforementioned necessary positioning can be performed by turning the rotating shaft j and moving it in the direction perpendicular to the axis thereof without the occurrence of leakage under vacuum.

However, in the conventional sealing construction using the bellows k as shown in FIG. 7, which is used for positioning in the vacuum vessel, the slidable contact portion between the vacuum seal m and the rotating shaft j is located in the vacuum region, so that dust produced here adheres to the wafer, resulting in the adverse effect of dust on the delicate processing operation and the degraded quality. Also, such a sliding portion is liable to be damaged and has a low physical life. If any trouble occurs, a vacuum break is caused, and the reliability as the wafer positioning mechanism is decreased. Further, the bellows k must have rigidity for overcoming a restoring force such as to be straightened by the vacuum in the direction such that the misalignment relative to the rotating shaft is eliminated and a deformation caused when following the movement in the direction perpendicular to the axis for the positioning of the rotating shaft j. This following action of the bellows k causes a load when the rotating stage c is moved in the direction perpendicular to the axis to perform the positioning, so that a design is required such as to satisfy the positioning rigidity requirement for overcoming this load, resulting in increased weight and size of the apparatus and therefore an increased cost. An object of the present invention is to provide a method and an apparatus for positioning a disk-shaped object, in which the life of a sealing portion is prolonged by using bellows, and the generation of dust and the effect thereof are prevented.

SUMMARY OF THE INVENTION

To attain the above object, with the method for positioning the disk-shaped object in accordance with the present invention, to position the disk-shaped object by supporting a disk-shaped object by a support member which can be rotated and moved in the direction perpendicular to the axis of the rotation, and by moving the support member from the outside of a vacuum vessel, the support member is extended to the outside of the vacuum vessel through an opening of the vacuum vessel and bellows one end of which is connected to the circumference of the opening without being in contact with the opening and the bellows and with a play such that the aforesaid movement can be performed, and the support member is received in a bulkhead portion by a roller bearing so as to be capable of rotating as described above, said bulkhead portion connected to the other end of the bellows and closing the other end of the bellows of a bearing support. The leakage under vacuum can be prevented by sealing the opening of the vacuum vessel that the support member passes through by using the bellows and the bulkhead of the support member, and at the same time the support member can be supported so as to be capable of rotating by eliminating a sliding portion located in the vacuum region by using the bulkhead and the roller bearing at the sealing portion, so that the decrease in life of the sealing portion caused by the sliding portion, the generation of dust, and the adhesion of dust to the object being positioned can be avoided.

Moreover, since necessary rotation is given to the support member from the outside of the bulkhead of the support member via a pair of inside and outside magnetic couplings facing each other on the inside and outside of the bulkhead in a state in which the play is present between the support member and the bellows, and movement in the direction perpendicular to the axis is given to the support member by moving the support member from outside in the direction perpendicular to the axis with respect to the vacuum vessel, the movement necessary for positioning is achieved while the sealing state and the non-contact state between the support member and the bellows are maintained, by which the positioning of the disk-shaped object can be performed.

By optically detecting the orientation and position of the disk-shaped object through a light transmitting window from the outside of the vacuum vessel to position the disk-shaped object, a detection mechanism needs not penetrate the vacuum vessel, so that sealing required by the penetration is unnecessary. Therefore, this configuration is especially suitable in the case where the detection mechanism is moved for detection.

The center position of the disk-shaped object can be detected if at least three positions at the outer periphery thereof are detected or at least two positions are detected when there is information about the diameter. Even if the movement in the direction perpendicular to the axis for positioning is unidirectional, unless a detected center position deviates from the diameter line in said direction, positioning can be effected by moving the disk-shaped object in said direction by a distance of deviation. If a detected center position deviates from the diameter line in said direction, positioning can be effected by performing the same operation after the disk-shaped object is turned so that the detected center position comes onto the diameter line. Even when it is desired to turn the disk-shaped object by supporting the center position by the support member to determine the orientation of the disk-shaped object, there is no problem because the supporting of the disk-shaped object by the support member may be tried again so that the support member is located at the center of the disk-shaped object after positioning the center position. The movement in the direction perpendicular to the axis for positioning may be once, so that the chances of occurrence of troubles associated with positioning and operation errors are reduced, and the reliability is improved. Also, both of the direction and frequency in and of which the bellows follow the positioning while being deformed are reduced. Since the necessary rigidity is reduced along with the positioning mechanism, the reliability and service life are further improved. Also, the apparatus for realizing this can be simplified and made compact and less costly.

In order to support the disk-shaped object once more by the support member as described above, after the once supported disk-shaped object is placed on an auxiliary tray to be separated from the support member and the movement in the direction perpendicular to the axis for the positioning is performed, the disk-shaped object on the auxiliary tray needs be lifted again by the support member whose position has been adjusted. For this purpose, it is preferable to perform the positioning by giving necessary vertical movement to the support member by moving the bearing support in the direction of the axis with respect to the vacuum vessel. The vertical movement of the support member gives convenience in other aspects.

The apparatus for positioning a disk-shaped object in accordance with the present invention is characterized by comprising a vacuum vessel; a support member for supporting the disk-shaped object by extending into the vacuum vessel from the outside and for positioning the disk-shaped object by the rotation, vertical movement, and movement in the direction perpendicular to the axis of the rotation; bellows one end of which is connected to the circumference of an opening that the support member in the vacuum vessel passes through so as to be capable of moving as described above without contact and which has a play such that the support member can move as described above without contact; a bearing support which has a vessel-form bulkhead extending downward and closing the other end of the bellows by being connected to the other end of the bellows, and receives the support member in the bulkhead by using a roller bearing; a moving base which is supported so as to be capable of moving in the direction perpendicular to the axis with respect to the vacuum vessel, and supports the bearing support so as to be capable of moving in the direction of the axis; first driving means for rotatively driving the support member on the bearing support via inside and outside magnetic couplings facing each other on the inside and outside of the bulkhead; second driving means for moving the bearing support together with the support member on the moving base in the direction of the axis with respect to the vacuum vessel; and third driving means for moving the moving base together with the bearing support on a fixed side common to the vacuum vessel in the direction perpendicular to the axis with respect to the vacuum vessel.

The rotation, vertical movement, and movement in the direction perpendicular to the axis of the support member are performed appropriately through the inside and outside magnetic couplings and the first and second support members by using the first, second, and third driving means. Therefore, the above-described characteristic positioning method can be realized automatically with high accuracy on the basis of guiding the support member to the bearing support by using the roller bearings and guiding the first and second support members by using the linear guides.

If the first driving means transmits the rotation of a motor on the bearing support to the outside magnetic coupling, and the third driving means transmits the rotation of the outside magnetic coupling to a cam provided on the bearing support through an electromagnetic clutch in order for movement in the direction perpendicular to the axis, and cooperates with a cam follower provided at a predetermined position on the fixed side, the motor can be used as drive source for both of the first and third driving means, so that the chances of occurrence of troubles and operation errors are reduced and the reliability is improved according as the necessary number of drive sources decreases, resulting in a simple and lightweight apparatus and reduced cost. Also, a configuration in which the rotation is converted into the movement in the direction perpendicular to the axis by the cam and the cam follower offers an advantage that the mechanism is compact and the movement can be controlled with high accuracy.

Other objects and features of the present invention will be apparent from the following detailed description and the accompanying drawings.

DESCRIPTION OF THE EMBODIMENTS

Figure 1:
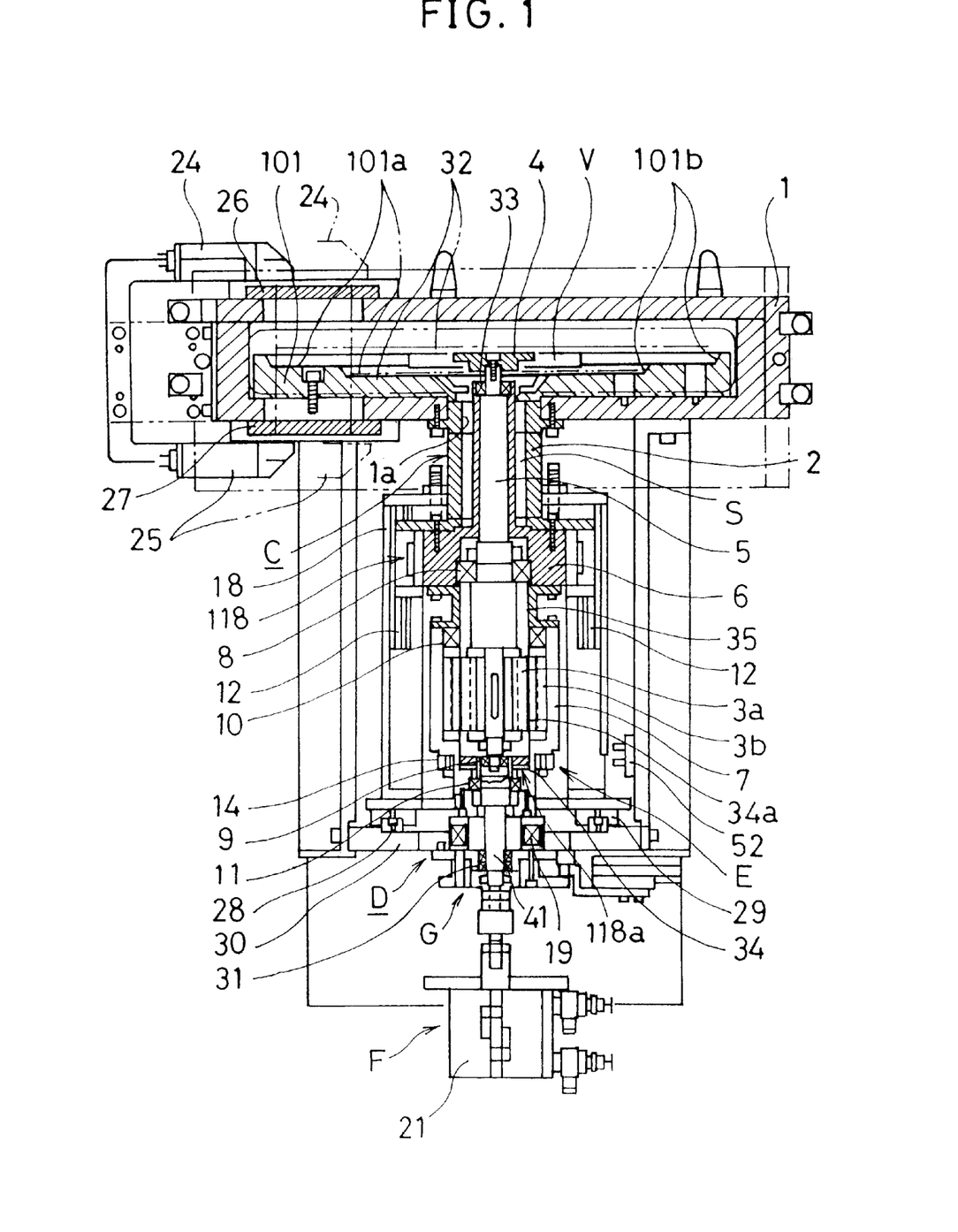
FIG. 1 is a longitudinal sectional view showing a method and an apparatus for positioning a disk-shaped object in accordance with the embodiments of the present invention.

An embodiment of the present invention will be described below with reference to the accompanying drawings to develop a clear understanding of the present invention. The method and apparatus for positioning a disk-shaped object of this embodiment are explained by taking a case where a semiconductor wafer 32 is used as the disk-shaped object as an example. However, the present invention is not limited to this case, but can be applied similarly to any disk-shaped object having directional qualities. In some cases, the present invention can be applied to a plate member of any other shape which requires similar positioning or can be positioned similarly. All of these cases belong to the scope of the present invention. A positioning method of this embodiment will be explained with reference to a positioning apparatus shown in FIGS. 1 to 5. As shown in FIG. 1, a wafer 32 is supported by a shaft-like support member 5, which can be rotated and moved in the X direction perpendicular to an axis Z of the rotation, in a vacuum vessel 1, and the wafer 32 is positioned by the aforementioned movement of the support member 5. The concrete shape of the support member 5 can be designed in any way as long as the positioning can be performed.

Figure 3:
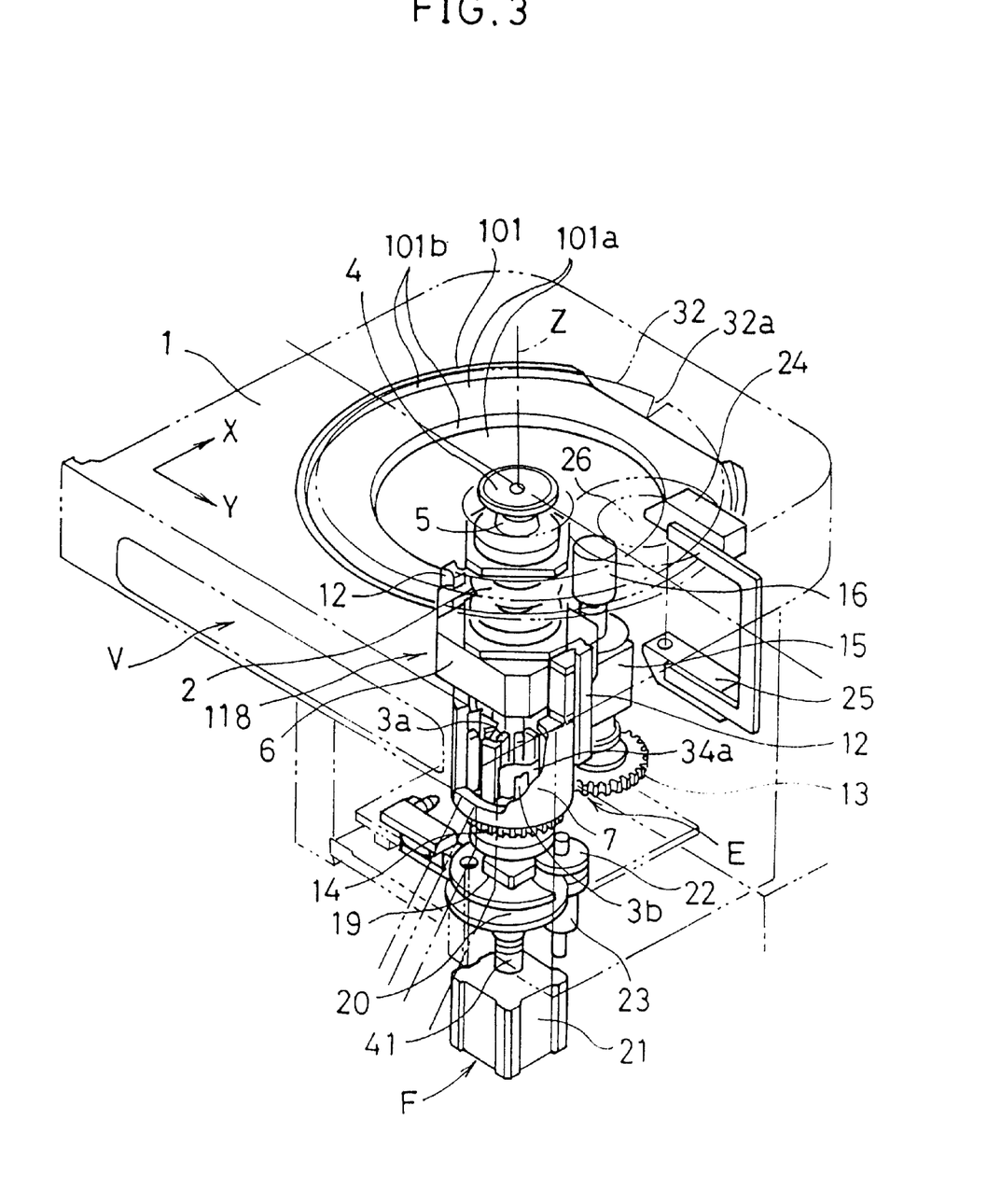
FIG. 3 is a partially cutaway side view in perspective of the apparatus shown in FIG. 1, viewed in a direction different from FIG. 2.

As shown in FIGS. 1 and 3, the support member 5 passes through an opening 1a of the vacuum vessel 1 and bellows 2 one end of which is connected to the circumference of the opening 1a, and extends to the outside of the vacuum vessel 1 with a play S such as to be capable of moving as described above without a contact with the opening 1a and the bellows 2. The support member 5 is received by roller bearings 33 in a bearing support 118 and by roller bearings 8 and 9 in a bulkhead portion 118a connected to the other end of the bellows 2 and closing the other end of the bellows 2 of bearing support 118 so as to isolate the external atmosphere. Since the support member 5 is in a slender shaft form, a rotating stage 4 having a larger diameter than that of the support member 5 is used as before to support the wafer 32. However, the form of the support member 5 is not limited to this, but can be designed freely. Various methods may be used; for example, the wafer 32 is directly supported by the top end of the support member 5.

With this method for receiving and supporting the support member 5, while the leakage under vacuum is prevented by sealing the opening 1a of the vacuum vessel 1 that the support member 5 passes through by using the bellows 2 and the bulkhead 118a of the bearing support 118, a sliding portion located in the vacuum region V is eliminated by the bulkhead 118a and the roller bearings 33, 8 and 9 at this sealing portion C, by which the support member 5 can be supported so as to be capable of being rotated. Thereby, the decrease in life of the sealing portion C caused by the sliding portion, the generation of dust, and the adhesion of the dust to the object being positioned can be avoided.

In the aforementioned receiving and supporting state of the support member 5, necessary rotation is given to the support member 5 from the outside of the bulkhead 118a of the bearing support 118 via a pair of inside and outside magnetic couplings 3a and 3b, which face each other on the inside and outside of the bulkhead 118a, and also necessary movement in the direction perpendicular to the axis is given to the support member 5 by moving the bearing support 118 in the direction perpendicular to the axis, for example in the X direction, with respect to the vacuum vessel 1 from the outside. Therefore, the movement necessary for positioning is achieved while the state of the sealing portion C and the non-contact state between the support member 5 and the bellows 2 are maintained, by which the positioning of the wafer 32 can be performed. For the movement in the direction perpendicular to the axis, it is a matter of course that in addition to the aforementioned movement in the X direction, the support member 5 may be moved in the Y direction perpendicular to the X direction to perform positioning as before.

In positioning the wafer 32, which is a disk-shaped object, as shown in FIGS. 1 and 3, the orientation and position of the wafer 32 are optically detected by sensors 24 and 25 etc. from the outside of the vacuum vessel 1 through light transmitting windows 26 and 27. Thereby, the sensors 24 and 25 etc., which are detecting mechanisms, are not required to pass through the vacuum vessel 1, so that sealing required by the penetration is unnecessary. This configuration is especially suitable in the case where the detecting mechanisms move for detection. In this embodiment, transmission laser range-finding sensors 24 and 25, in which a pair of light emitting and receiving devices are combined, are used as an optical mechanism. These sensors 24 and 25 can be moved between the position indicated by the solid line in FIG. 1 and the position indicated by the imaginary line, so that they can detect the position of the wafer 32 ranging from small diameter to large diameter. As one example, the detection width of the laser range-finding sensors 24 and 25 at each movement position is about 10 mm. The outer peripheral position of the necessary place when the wafer 32 is turned within this width of 10 mm is detected, by which the center position of the wafer 32 can be judged. The aforementioned positioning operation can be performed so that the detected center position comes to the predetermined position.

The center position of the wafer 32, which is a disk-shaped object, can be detected if at least three positions are detected or at least two positions are detected when there is information about the diameter or the radius. To position the detected center position, the movement in the direction perpendicular to the axis may be only the movement in the aforementioned one direction perpendicular to the axis, the X direction. However, if an orientation flat or a notch 32a as shown in FIG. 3 is detected in detecting the outer peripheral position of the wafer 32, it becomes a noise of the center position detection information. To eliminate the effect of this noise, one more outer peripheral position in addition to the minimum necessary position is detected. If a noise position signal is present, it is excluded to detect the center position.

Unless the detected center position deviates from the diameter line of the wafer 32 in the direction perpendicular to the axis, positioning can be effected by moving the wafer 32 in the X direction by the distance of deviation in the X direction. Even if the detected center position deviates from the diameter line in the X direction, positioning can be effected by performing the same operation after the wafer 32 is turned so that the detected center position comes onto the diameter line. Also, even when it is desired to turn the wafer 32 by supporting the center position by the support member 5 to make the orientation of the wafer 32 the predetermined orientation after the center position deviating from the X direction is moved onto the diameter line, there is no problem because the wafer 32 may be supported by the support member 5 once more so that the support member 5 is located at the center of the wafer 32 after positioning the center position. Thus, the movement in the direction perpendicular to the axis for positioning decreases to one, so that the occurrence of a trouble for positioning and an operation error is decreased, and the reliability is improved. Also, both of the direction and frequency in which the bellows 2 follow the positioning while being deformed are reduced. Since the necessary rigidity is reduced along with the positioning mechanism D, the reliability and the life are further improved. Also, the apparatus for realizing this can be simplified and made compact and less costly.

In this embodiment, when the wafer 32 is supported once more by the support member 5, by lowering the support member 5 after supporting and positioning the wafer 32, the wafer 32 having been supported by the support member 5 is once placed at the bottom of the vacuum vessel 1 or an auxiliary tray 101 provided at the bottom as shown in FIGS. 1 and 3 of this embodiment to separate the support member 5 downward from the wafer 32, and the support member 5 in the state of being separated from the wafer 32 is moved to the center position at which the wafer 32 is positioned. Then, by lifting the support member 5 after being moved, the wafer 32 is raised and supported from the downside at the positioned center position. If the support member 5 is turned in this state, the wafer 32 is turned around the center position so as to be positioned in the predetermined orientation. Unlike the case where the orientation of the wafer 32 is adjusted with the position deviating from the center position of the wafer 32 being the rotation center, the center position of the wafer 32 is not changed, and a complex operation for responding to such a change is unnecessary. Thus, in order to support the wafer 32 once more by the support member 5, in this embodiment, the bearing support 118 for receiving and supporting the support member 5 is moved in the Z direction of the axis with respect to the vacuum vessel 1, by which the support member 5 is moved vertically to support the wafer 32 once more.

Figure 2:
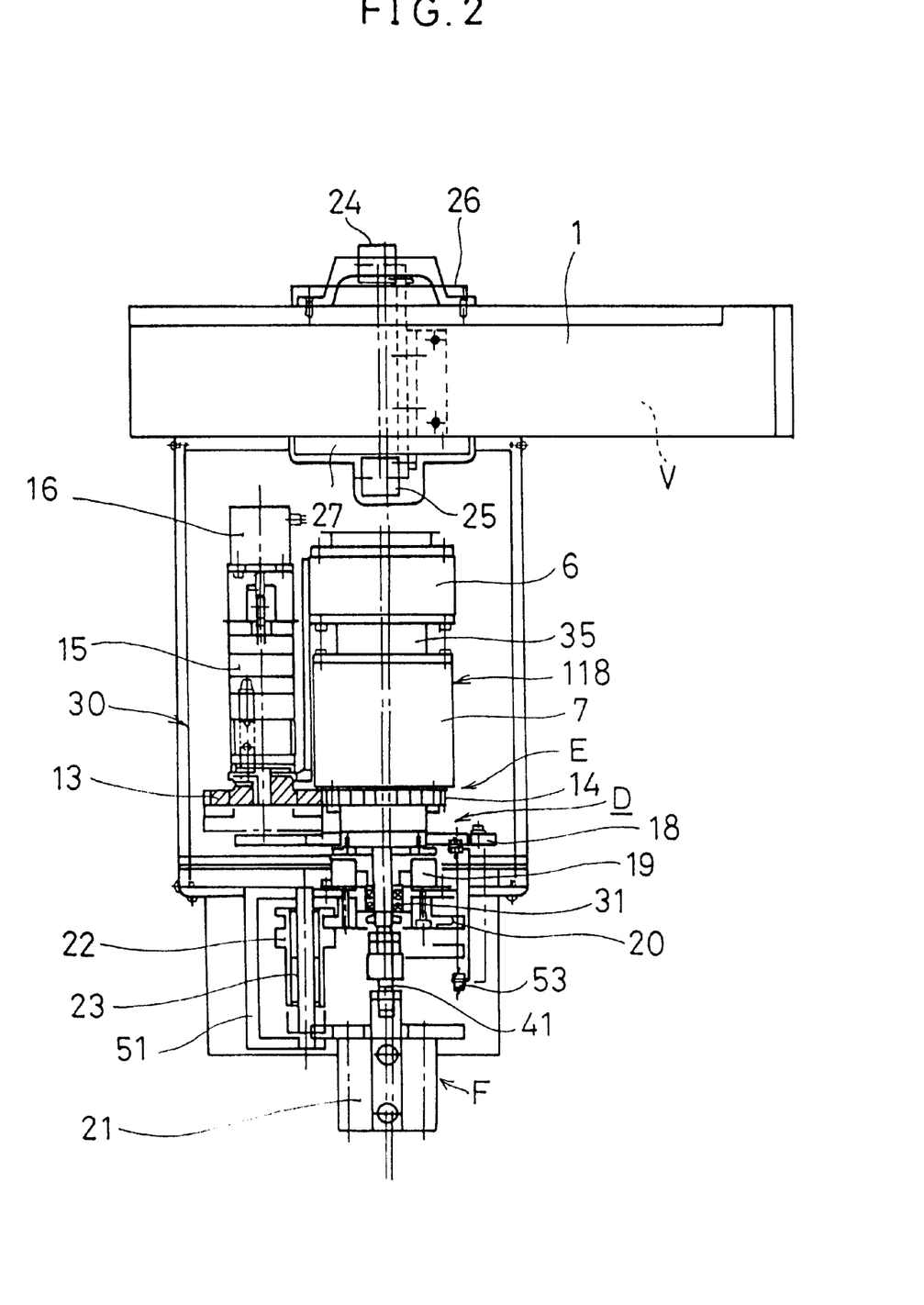
FIG. 2 is a longitudinal sectional view of the apparatus shown in FIG. 1.

To perform the aforementioned positioning operation, the apparatus for positioning a disk-shaped object of this embodiment has, as shown in FIGS. 1 to 3, the vacuum vessel 1; the support member 5, which is located in the vacuum vessel 1 so as to extend from the outside, for supporting the wafer 32 and for positioning the wafer 32 by the rotation, vertical movement, and movement in the X direction perpendicular to the axis Z of the rotation; the bellows 2 one end of which is connected to the circumference of the opening 1a of the vacuum vessel 1 penetrating so that the support member 5 can be moved as described above without contact and which has a play S by which the support member 5 can be moved as described above without contact; and the bearing support 118 which has the vessel-form bulkhead 118a extending downward so as to be connected to the other end of the bellows 2 and to close the other end of the bellows 2 and receives the support member 5 by using the roller bearings 33, 8 and 9 in the bulkhead 118a. Further, the apparatus includes a moving base 18 which is supported by linear guides 28 and 29 shown in FIG. 1 so as to be capable of moving in the direction perpendicular to the axis with respect to the vacuum vessel 1 or a bracket 30 attached to the vacuum vessel 1, for example as shown in FIGS. 1 and 2, which is the fixed side integral with the vacuum vessel 1, and is supported by a linear guide 12 shown in FIGS. 1 and 3 so that the bearing support 118 can be moved in the Z direction of the axis; first driving means E for rotatively driving the support member 5 via the inside and outside magnetic couplings 3a and 3b facing each other on the inside and outside of the bulkhead 118a on the bearing support 118 as shown in FIGS. 1 to 6; second driving means F for moving the bearing support 118 in the Z direction of the axis with respect to the vacuum vessel 1 on the moving base 18 as shown in FIGS. 1 to 3; and third driving means G for moving the moving base 18 in the X direction perpendicular to the axis with respect to the vacuum vessel 1 on the bracket 30 as shown in FIGS. 1 to 3.

The detection width of the laser range-finding sensors 24 and 25, which are detecting mechanisms, is 10 mm, and the range in which the outer peripheral position of the wafer 32 can be detected is ±5 mm in width. However, if the position deviates greatly when the rotating stage 4 receives the wafer 32, the outer periphery of the wafer 32 sometimes deviates from the aforementioned detection range, so that the position detection for positioning cannot be carried out. For this reason, the aforementioned auxiliary tray 101 is provided in the vacuum vessel 1 to preliminarily perform rough positioning so that the outer periphery of the wafer 32 received by the rotating stage 4 does not deviate from the detection range. As shown in FIGS. 1 and 3, the auxiliary tray 101 has a tapered face 101b spreading upward form a receiving face 101a. The wafer 32 is dropped onto the receiving face 101a while being guided by the tapered face 101b, whereby the preliminary positioning is performed so that the wafer 32 falls into the detection range. As one example, there are provided two sets, large and small, of the receiving faces 101a and the tapered faces 101b so as to accommodate two large and small wafers 32 shown in FIGS. 1 and 3. For the preliminary positioning of the wafer 32, the support member 5 lowers and waits so that the wafer 32 is received, or the support member 5 lowers the wafer 32 received by rising and drops it onto the receiving face 101a. Subsequently, it is necessary for the support member 5 to rise and lift the wafer 32, which has been roughly positioned preliminarily, to transfer to the inherent positioning operation.

In this embodiment, the vertical movement of the support member 5 is indispensable for the preliminary positioning of the wafer 32 and for the supporting of the wafer 32 performed once more by the support member 5. However, when the preliminary positioning as described above is not performed, or when the wafer 32 need not be supported once more by the support member 5 because of the movement for positioning in the orthogonal two directions perpendicular to the axis performed as in the case of the prior art, the vertical movement of the support member 5 is not particularly indispensable for the positioning of the wafer 32, which also belongs to the scope of the present invention. However, the vertical movement of the support member 5 is effective in avoiding the interference with the movement of the wafer 32 loaded into or unloaded from the vacuum vessel 1, so that it can be used even if it is not indispensable for positioning.

By appropriately performing the rotation, vertical movement, and movement in the X direction perpendicular to the axis of the support member 5 through the inside and outside magnetic couplings 3a and 3b, the bearing support 118, and the moving base 18 by using the first, second, and third driving means E, F and G, the above-described characteristic positioning method can be realized automatically with high accuracy on the basis of guiding the support member 5 to the bearing support 118 by using the roller bearings 33, 8 and 9 and guiding the moving base 18 and the bearing support 118 by using the linear guides 12, 28 and 29.

Figure 4:
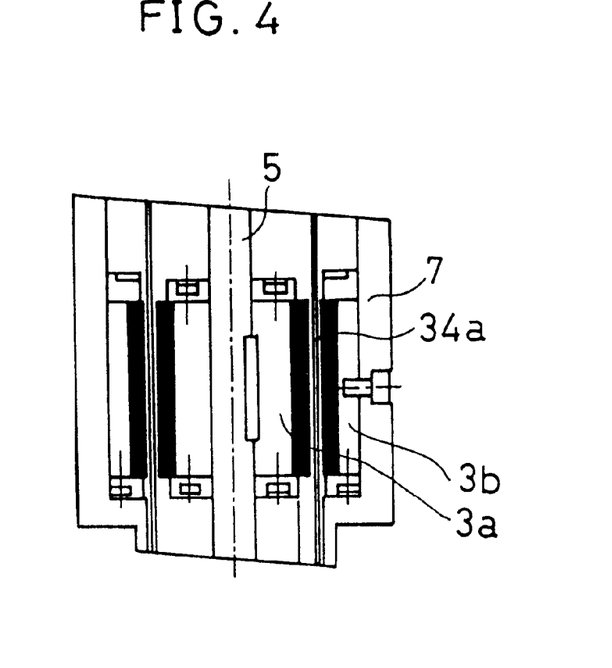
FIG. 4 is a longitudinal sectional view of a magnetic coupling portion of the apparatus shown in FIG. 1.
Figure 5:
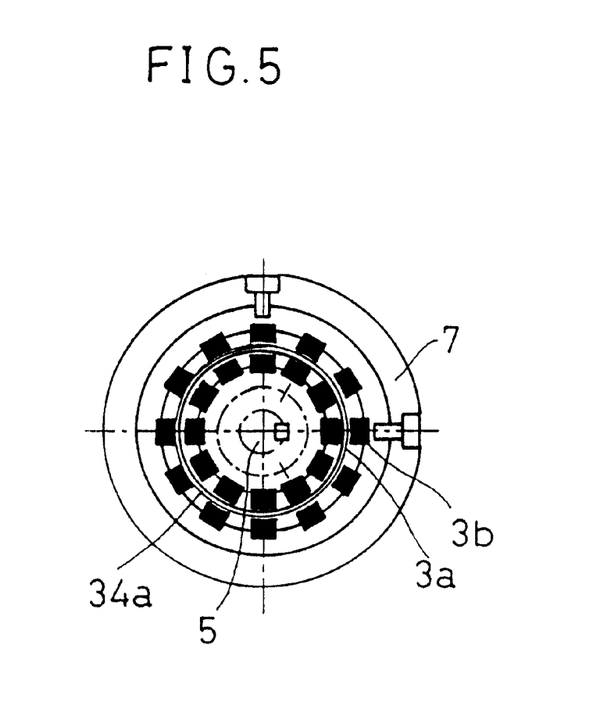
FIG. 5 is a transverse sectional view of a magnetic coupling portion of the apparatus shown in FIG. 1.

In the construction of this embodiment shown in FIGS. 1 to 5, the bulkhead 118a is formed into a combined body in which a block 6, a connection ring 35, and a bottomed vessel-form member 34 having a magnetically permeable bulkhead portion 34a between the magnetic couplings 3a and 3b are connected as shown in FIGS. 1 to 5 in order to accommodate a complex shape required for a complex support structure around the support member 5 and the arrangement of the magnetic couplings 3a and 3b. An outer cylinder 7 is fitted at the upper and lower portions clear of the magnetically permeable portion 34a at the outer periphery of the vessel-form member 34 so as to be rotated by being received by roller bearings 10 and 11 as shown in FIG. 1. As shown in FIGS. 4 and 5, an outside magnetic coupling 3b located on the outside of the magnetically permeable bulkhead portion 34a is fixed to the inner periphery of the outer cylinder 7, and an inside magnetic coupling 3a located on the inside of the magnetically permeable bulkhead portion 34a is fixed to the outer periphery of the support member 5.

As shown in FIGS. 1, 4 and 5, since the inside and outside magnetic couplings 3a and 3b face each other via the magnetically permeable bulkhead portion 34a, the first driving means E transmits the rotation of a motor 15 on the bearing support 118 to the outer cylinder 7 having the outside magnetic coupling 3b via gears 13 and 14 shown in FIGS. 1 to 3, and transmits the rotation of the outer cylinder 7 by magnetism from the outside magnetic coupling 3b to the inside magnetic coupling 3a via the magnetically permeable bulkhead portion 34a as shown in FIGS. 1 to 3, thereby rotatively driving the support member 5. Although the rotation for positioning may be unidirectional, the rotation in the normal and reverse directions is effected in some cases, by which the rotational direction such that the positioning time is shorter can be employed.

The third driving means G has a heart cam 20 fitted so as to be rotated by the bearing 31 on a shaft 41 provided so as to project from the rotating stage 4 to below the outer cylinder 7 as shown in FIGS. 1 and 2, so that the rotation of the outer cylinder 7 can be transmitted to the heart cam 20 appropriately via an electromagnetic clutch 19 as shown in FIGS. 1 to 3. A cam follower 22 is provided at a predetermined position on the moving base 18 so as to face the heart cam 20 on the shaft 41, so that the heart cam 20 comes into contact with the cam follower 22 while being rotatively driven. Thereby, the shaft 41 is separated from the cam follower 22 in accordance with the rotational amount of the shaft 41, so that the moving base 18, bearing support 118, and support member 5 are moved integrally in the X direction perpendicular to the axis. The restoring force against the movement in the X direction perpendicular to the axis for the heart cam 20 for continuing being in contact with the cam follower 22 is enough to be the restoring force of the bellows 2. However, if the restoring force of the bellows 2 is insufficient, a restoring spring may be provided on the bellows 2 or may be operated separately. Thereby, the motor 15 can be used as drive source for both of the first and third driving means E and G, so that the occurrence of trouble and operation error is reduced and the reliability is improved with the decrease in the necessary number of drive sources, resulting in a simple and lightweight apparatus and reduced cost. Also, a configuration in which the rotation is converted into the movement in the X direction perpendicular to the axis by the heart cam 20 and the cam follower 22 offers an advantage that the mechanism is compact and the movement can be controlled with high accuracy. The heart cam 20 is moved vertically with the vertical movement of the support member 5, and the cam follower 22 is received by a stroke bearing 23 on a frame 51, as shown in FIGS. 2 and 3, installed to the moving base 18 so as to be moved vertically and rotated, so that the cam follower 22 follows the rotation and vertical movement of the heart cam 20 naturally.

The second driving means F vertically moves the support member 5 together with the bearing support 118 on the moving base 18 via the shaft 41 by connecting an elevating cylinder 21 installed on the moving base 18 to the shaft 41.

However, the specific configurations of the first to third driving means E to G are not limited to those shown in the figures, but can be designed in any way.

In this embodiment, information about the amount of movement necessary for the support member 5, the present position, or the like is necessary to optically detect the position and orientation for positioning the wafer 32. To obtain the information, a sensor is provided to detect the amount of rotation of the support member 5. As one example of this sensor, an encoder 16 is used to optically detect the amount of rotation of the motor 15. Also, there is provided a sensor for detecting the amount of movement of the moving base 18 with respect to the side of the vacuum vessel 1. As one example of this sensor, a straight encoder 52 is used to optically detect the amount of movement of the moving base 18 with respect to the bracket 30. For the vertical movement of the support member 5, the necessity for the detection of the movement position and present position thereof is eliminated by the stroke setting of the elevating cylinder 21. However, a sensor for such detection can be provided as necessary. Further, as one example, the position of origin of the heart cam 20 is detected optically by a sensor, and a photocoupler 53 as shown in FIG. 2 is used. For these sensors, various already-known types can be used.

According to the method for positioning a disk-shaped object in accordance with the present invention, the leakage under vacuum can be prevented by sealing the opening of the vacuum vessel that the support member passes through by using the bellows and the bulkhead of the support member, and at the same time the support member can be supported so as to be capable of being rotated by eliminating the sliding portion located in the vacuum region by using the bulkhead and the roller bearings at the sealing portion, so that the decrease in life of the sealing portion caused by the sliding portion, the generation of dust, and the adhesion of the dust to the object being positioned can be avoided. Moreover, the movement necessary for positioning is achieved, and the positioning of the disk-shaped object can be performed while maintaining the sealing state and the non-contact state between the support member and the bellows. Also, by using single movement in the direction perpendicular to the axis to perform positioning, the occurrence of a trouble in positioning and an operation error is reduced and the reliability is improved. In addition, both of the direction and frequency in which the bellows follow the positioning while being deformed are reduced, and the necessary rigidity is decreased along with the positioning mechanism. Therefore, the reliability and the life can be improved further, and the apparatus for realizing this can be simplified and made compact and less costly. Further, according to the apparatus for positioning a disk-shaped object in accordance with the present invention, the rotation, vertical movement, and movement in the direction perpendicular to the axis of the support member are performed appropriately through the inside and outside magnetic couplings and the first and second support members by using the first, second, and third driving means. Therefore, the above-described characteristic positioning method can be realized automatically with high accuracy on the basis of guiding the support member to the bearing support by using the roller bearings and guiding the first and second support members by using the linear guides.

What is claimed is:

1. A method for positioning a disk-shaped object, in which a disk-shaped object is supported by a support member which can be rotated about an axis of rotation and moved in a direction perpendicular to the axis of the rotation in a vacuum vessel, and the support member is moved from outside of the vacuum vessel to position the disk-shaped object, said method comprising:

extending the support member to the outside of the vacuum vessel through an opening in the vacuum vessel and through an opening in a bellows, one end of the bellows being connected to a surface defining the vacuum vessel opening and the other end being connected to an opening in a bearing support, the support member being spaced from the opening and the bellows to provide sufficient play for movement of the support member in the perpendicular direction, and arranging the support member in a bulkhead portion of said bearing support, said bulkhead portion having a roller bearing for rotation of the support member, said bulkhead portion being connected to the other end of the bellows and closing the opening in said bearing support connected to the other end of the bellows;

providing necessary rotation to the support member from the outside of the bulkhead portion via a pair of inside and outside magnetic couplings facing each other on the inside and outside of the bulkhead portion; and moving the support member in the direction perpendicular to the axis of rotation by moving the bearing support in the direction perpendicular to the axis of rotation with respect to the vacuum vessel.

2. The method for positioning a disk-shaped object according to claim 1, wherein the positioning is performed by giving necessary vertical movement to the support member by moving the bearing support in the direction of the axis with respect to the vacuum vessel.

3. The method for positioning a disk-shaped object according to claim 1, wherein the orientation and position of the disk-shaped object is optically detected through a light transmitting window from the outside of the vacuum vessel to position the disk-shaped object.

4. The method for positioning a disk-shaped object according to claim 1, wherein the movement in the direction perpendicular to the axis is unidirectional.

* * * * *